(12) United States Patent
Zepf et al.

(10) Patent No.: US 9,661,769 B2
(45) Date of Patent: May 23, 2017

(54) LOCKABLE PRESSURE CASING

(71) Applicant: Aesculap AG, Tuttlingen (DE)

(72) Inventors: Rudolf Zepf, Wurmlingen (DE); Rolf Schnekenburger, Tuttlingen (DE); Ralf Krause, Nufringen (DE); Joachim Guba, Nufringen (DE)

(73) Assignee: Aesculap AG (DE)

( * ) Notice: Subject to any disclaimer, the term of this patent is extended or adjusted under 35 U.S.C. 154(b) by 0 days.

(21) Appl. No.: 15/022,747

(22) PCT Filed: Sep. 16, 2014

(86) PCT No.: PCT/EP2014/069672
§ 371 (c)(1),
(2) Date: Mar. 17, 2016

(87) PCT Pub. No.: WO2015/040011
PCT Pub. Date: Mar. 26, 2015

(65) Prior Publication Data
US 2016/0295723 A1 Oct. 6, 2016

(30) Foreign Application Priority Data

Sep. 19, 2013 (DE) ........................ 10 2013 110 383

(51) Int. Cl.
*H05K 5/04* (2006.01)
*H05K 5/02* (2006.01)
*H05K 9/00* (2006.01)

(52) U.S. Cl.
CPC ......... *H05K 5/0221* (2013.01); *H05K 5/0239* (2013.01); *H05K 9/0009* (2013.01)

(58) Field of Classification Search
CPC ...... H05K 5/04; H05K 5/0004; H05K 5/0221; H05K 5/0239; H05K 9/0009
(Continued)

(56) References Cited

U.S. PATENT DOCUMENTS

| | | |
|---|---|---|
| 3,039,837 A | 6/1962 | Poe |
| 5,192,222 A | 3/1993 | Krause |

(Continued)

FOREIGN PATENT DOCUMENTS

| | | |
|---|---|---|
| DE | 1101564 | 3/1955 |
| DE | 3602446 | 1/1986 |

(Continued)

OTHER PUBLICATIONS

German Search Report dated Aug. 27, 2014 for German Application No. 10 2013 110 383.9 with translation.

*Primary Examiner* — James O Hansen
(74) *Attorney, Agent, or Firm* — RatnerPrestia

(57) ABSTRACT

A housing for an electric or electronic apparatus includes an access hood, or access lid which can be fixed on the housing for closing the housing or a housing opening by a locking mechanism operable from outside the housing. The locking mechanism includes at least one lock/slide held on the housing or on the access hood/access lid so as to be longitudinally displaceable and is provided with a ramp and an undercut or detent lug spaced therefrom. The access hood/access lid or the housing is provided with at least one protrusion which is formed and/or arranged for defining two engagement means in such a manner that depending on the current sliding position of the lock/slide, it alternately comes into operative engagement with the associated detent lug for pulling the access hood/access lid toward the housing, or with the ramp for pushing it away from the housing.

8 Claims, 3 Drawing Sheets

Figure 1:
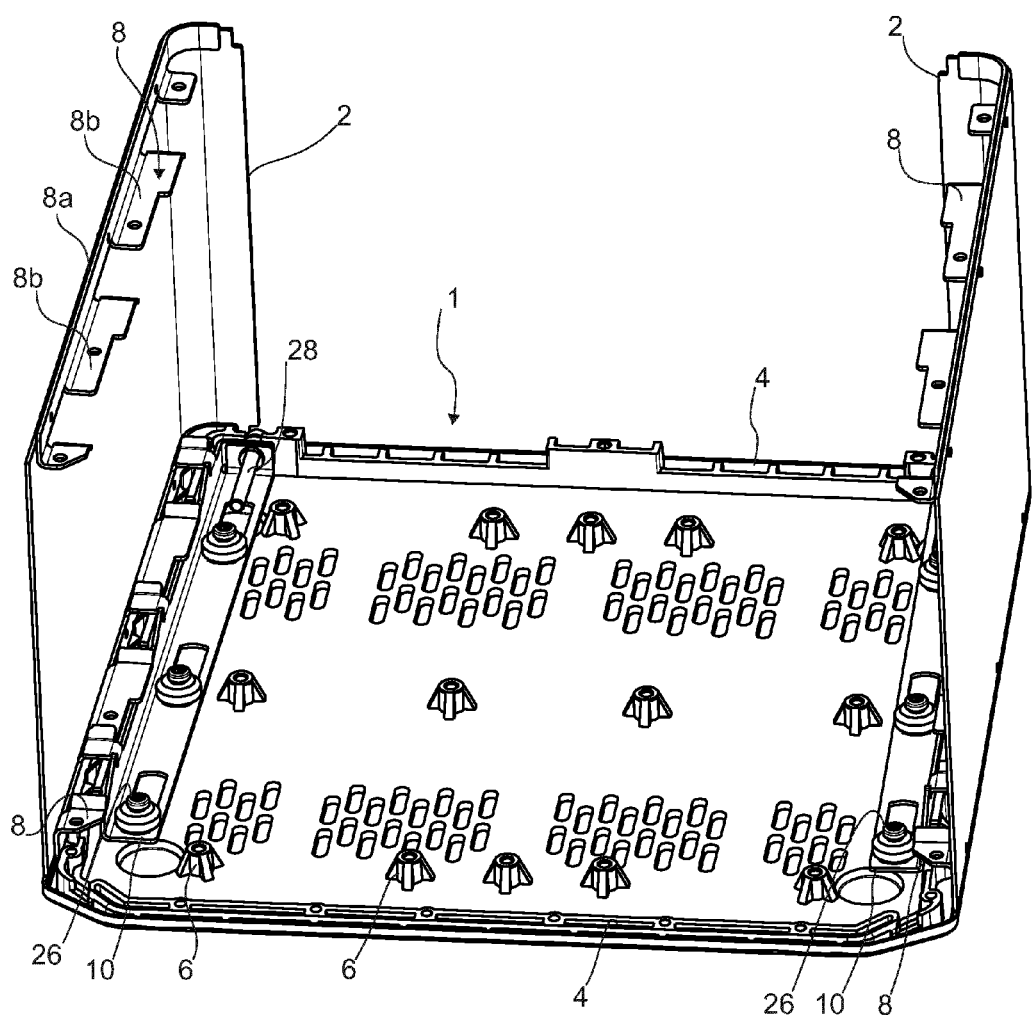

(58) Field of Classification Search
USPC .................. 312/257.1, 223.1, 223.2, 265.6; 361/679.02, 679.58, 724, 726
See application file for complete search history.

(56) References Cited

U.S. PATENT DOCUMENTS

| | | | | |
|---|---|---|---|---|
| 6,157,532 | A * | 12/2000 | Cook .................. | E05B 65/006 292/146 |
| 6,297,948 | B1 * | 10/2001 | Buican ................ | G06F 1/181 206/320 |
| 6,932,447 | B2 * | 8/2005 | Chen .................. | A47B 88/06 312/223.2 |
| 7,539,010 | B2 * | 5/2009 | Chen .................. | G06F 1/181 361/679.58 |
| 8,608,259 | B2 * | 12/2013 | Wu .................... | G06F 1/181 312/223.2 |
| 2002/0167790 | A1 * | 11/2002 | Gan .................... | G06F 1/181 361/679.58 |
| 2004/0106331 | A1 | 6/2004 | Hoegener | |

FOREIGN PATENT DOCUMENTS

| | | |
|---|---|---|
| DE | 4032801 | 4/1992 |
| DE | 10013134 | 3/2000 |
| DE | 10245328 | 11/2003 |

* cited by examiner

LOCKABLE PRESSURE CASING

RELATED APPLICATIONS

This application is the U.S. National Phase entry of International Application No. PCT/EP2014/069672, filed Sep. 16, 2014, which claims the benefit of priority of German Application No. 10 2013 110 383.9, filed Sep. 19, 2013. The contents of International Application No. PCT/EP2014/069672 and German Application No. 10 2013 110 383.9 are incorporated by reference herein in their entireties for all purposes.

FIELD

The present invention relates generally to a lockable housing (pressure housing), and in particular to a housing for a medical apparatus.

BACKGROUND

In particular in medical technology, but also in the field of automotive engineering or aircraft construction, there is the basic need to accommodate electric apparatuses and electronic components in so-called protective housings which on the one hand protect the apparatuses and components against external effects such as humidity, dirt and shocks/impacts/vibrations and, on the other hand, effectively prevent the escape of electromagnetic waves from the housing.

Such housings usually comprise at least one installation opening which can be closed with an installation flap or hood.

From the prior art, housings of the previously described kind are well known. Said housings consist of a base plate which has four side walls screwed or welded to its periphery. A housing lid comprises a peripherally surrounding installation frame which reaches over or behind the side walls when the cover is attached. Finally, through-holes are provided on the side walls as well as on the surrounding installation frame, and preferably self-tapping screws or metal screws can be screwed into said through-holes in order to mount the cover to the side walls.

The problem with this commonly known housing construction is that already minute gaps or clearances between the individual housing parts may result in electromagnetic waves escaping from the housing interior. What is more, dust particles and moisture penetrate these "installation gaps" and damage the enclosed components. The latter could in fact be prevented by corresponding sealings, but these are usually made of a synthetic material (non-metallic) and thus are permeable to electromagnetic waves.

In order to provide a housing which is tight against moisture and dust as well as isolated in terms of electromagnetic waves, the individual housing components have to be manufactured with high precision and even the installation is to be carried out with high expenditure. This is why the housing parts have to be provided with tongue-and-groove edges and the holes provided for the screw fixation have to be set so precise that the predefined relative positions are not altered during screwing the individual housing parts. This expenditure in the preparation and installation of the housing parts results in the entire housing becoming expensive and its handling impractical.

SUMMARY

In view of these problems, it is the object of the present invention to provide an (apparatus) housing preferably for medical purposes, which is distinguished by a simple assembly and easy servicing. A preferred aim is to reduce the assembly time of the housing and hence of the entire (electric/electronic) apparatus. A further preferred aim is to form the housing as a Faraday cage in order to avoid on the one hand an escape of electromagnetic waves/radiation from the housing interior towards outside, but also to prevent any external interfering radiation from entering the apparatus housing.

The object and possibly the further aims of the present invention are achieved by a (medical) apparatus housing comprising the features described herein.

The invention is based on the consideration to use the screws—which by then are employed as detachable connection elements between two housing parts—only in indirect manner as adjusting devices for actuating a locking mechanism. Such a locking mechanism according to the invention for connecting two housing parts usually comprises a lock or slide having an undercut/detent lug and a ramp, with the lock/slide being movably supported on a first housing part and being operable from outside preferably by means of the set screw or any other adjusting mechanism such as a knee lever, for example. A first engagement means for the undercut/detent lug and a second engagement means for the ramp are arranged/formed on a second housing part.

The two engagement means as well as the undercut/detent lug are arranged such that the undercut/detent lug comes into operative engagement with the first engagement means upon a locking movement of the lock/slide, whereas the ramp leaves the engagement with the second engagement means. Thus, the first engagement means and hence the associated housing part is pulled toward the lock/slide and hence to the associated housing part. If instead the lock/slide is operated so as to move in an opening/release direction, the undercut/detent lug leaves the engagement with the first engagement means, whereas the ramp comes into operative engagement with the second engagement means. As a result, the second engagement means and hence the associated housing part is pushed away from the lock/slide and hence from the associated housing part.

In other words, according to one aspect of the present invention, a housing of an electric or electronic apparatus preferably of medical design is suggested, comprising an access hood, access lid or similar housing part which can be fixed on the housing for closing the housing or a housing opening by means of a locking mechanism which can be operated from outside the housing. The locking mechanism comprises at least one lock/slide which is held on a first housing part, namely on the housing or on the access hood/access lid, so as to be longitudinally displaceable and is provided with a ramp and an undercut or a detent lug spaced therefrom in the sliding direction, whereas the second housing part, namely the access hood/access lid or the housing, is provided with at least one protrusion which is formed and/or arranged for defining two engagement means in such a manner that depending on the current sliding position of the lock/slide it alternately comes into operative engagement with the associated detent lug for pulling the access hood/access lid toward the housing or with the ramp for pushing it away from the housing.

Due to forming the lock/slide with the detent lug, an enormous bracing force can be applied to housing parts to be connected with each other, pulling the two housing parts towards each other. This bracing force results on the one hand from the shape of the detent lug, which increasingly engages behind the engagement means, for instance in the form of a bolt-like protrusion, in the manner of a hook and in this way pulls it up more and more, and on the other hand from the type of the adjusting mechanism for actuating the lock/slide, for instance in the form of a set screw. In order to release this enormous bracing force again, which also brings about a self-locking effect of the locking mechanism, and to release the two housing parts braced with each other, the ramp is provided which is pressed in the manner of a wedge against the associated engagement means, for instance also in the form of a bolt-like protrusion, while the detent lug releases its engagement means or has released it. In this way, both housing parts which initially are firmly connected to each other can be separated from each other by force.

This construction of the locking mechanism allows to optimize the contact points of the two housing parts such that they are impermeable to electromagnetic radiation. By way of example, a tongue-and-groove connection may be provided between the two housing parts, which has such a design that a tight press-fit is produced. As the locking mechanism exerts constraining forces on the two housing parts both in the locking direction and in the release direction, the press-fit can be established but also released by force.

Preferably, the housing according to the invention comprises a base plate, a number of side walls as well as the at least one access hood or access lid which, as already explained above, can be put together preferably according to the tongue-and-groove principle. To this end, at least one groove or also several grooves may be formed at least on the housing's inner surface of the base plate along its circumference, with their respective groove depth being oriented so as to be perpendicular to the housing's inner surface for the upright plug-in reception of the side walls and preferably the access hood/access lid. It goes without saying that such grooves may also be provided on the access hood/access lid and/or on the side walls, in fact such that the housing put together from said parts comprises the groove-and-tongue connection on selected longitudinal edges or on all longitudinal edges.

According to another aspect of the present invention, a number of serially spaced guide pins is formed on at least one housing part or on selected housing parts, namely the base plate, the side walls and/or the access hood/access lid at the edge on the respective housing's inner surface of the corresponding housing part, which are provided for longitudinally guiding the lock/slide. Preferably, the lock/slide can be manufactured from a sheet metal part, but can also be a cast metal part.

It is preferred that the lock/slide comprises a number of longitudinal through-slots which are serially spaced in longitudinal direction and in which the guide pins are inserted or can be inserted so as to slide in the longitudinal direction. In other words, the guide pins together with the longitudinal through-slots constitute a sort of slot-type guide for the lock/slide. Alternatively, a dovetail guide, a curtain guide or similar guiding slot would also be conceivable. It is of advantage if the guide prevents the lock/slide from being unintentionally lifted off. In the case of guide pins, these can be provided with axial internal threads into which retaining screws can be screwed after attachment of the lock/slide.

According to a further or another aspect of the invention, an actuation mechanism is provided for longitudinally displacing the respective lock/slide from outside the housing. This actuation mechanism may be a set screw, for instance, which is screwed in a selected housing part, namely the base plate, the side plates and/or the access hood/access lid in the sliding direction of the associated lock/slide and has its front face engaging the associated lock/slide in order to push and pull the latter in its longitudinal direction. There are also other designs for the actuation mechanism such as a knee lever construction, for example.

Further, it is advantageous if the at least one protrusion is provided by a separate engagement means component which is fixed or can be fixed on selected housing parts, namely the base plate, the side walls and/or the access hood/access lid. On the one hand, this has the effect of reinforcing/stiffening the respective housing part to which the engagement means component is mounted; on the other hand, the engagement means component can be finely adjusted during its installation in order to ensure a good functioning of the locking mechanism in cooperation with the associated lock/slide.

It is preferred that the engagement means component is formed as a sheet metal part or cast metal part and comprises a number of lug- or bolt-shaped, longitudinally spaced protrusions which each define one or two engagement means for the cooperation with the detent lug and/or the ramp on the lock/slide.

BRIEF DESCRIPTION OF THE DRAWING FIGURES

Figure 2:
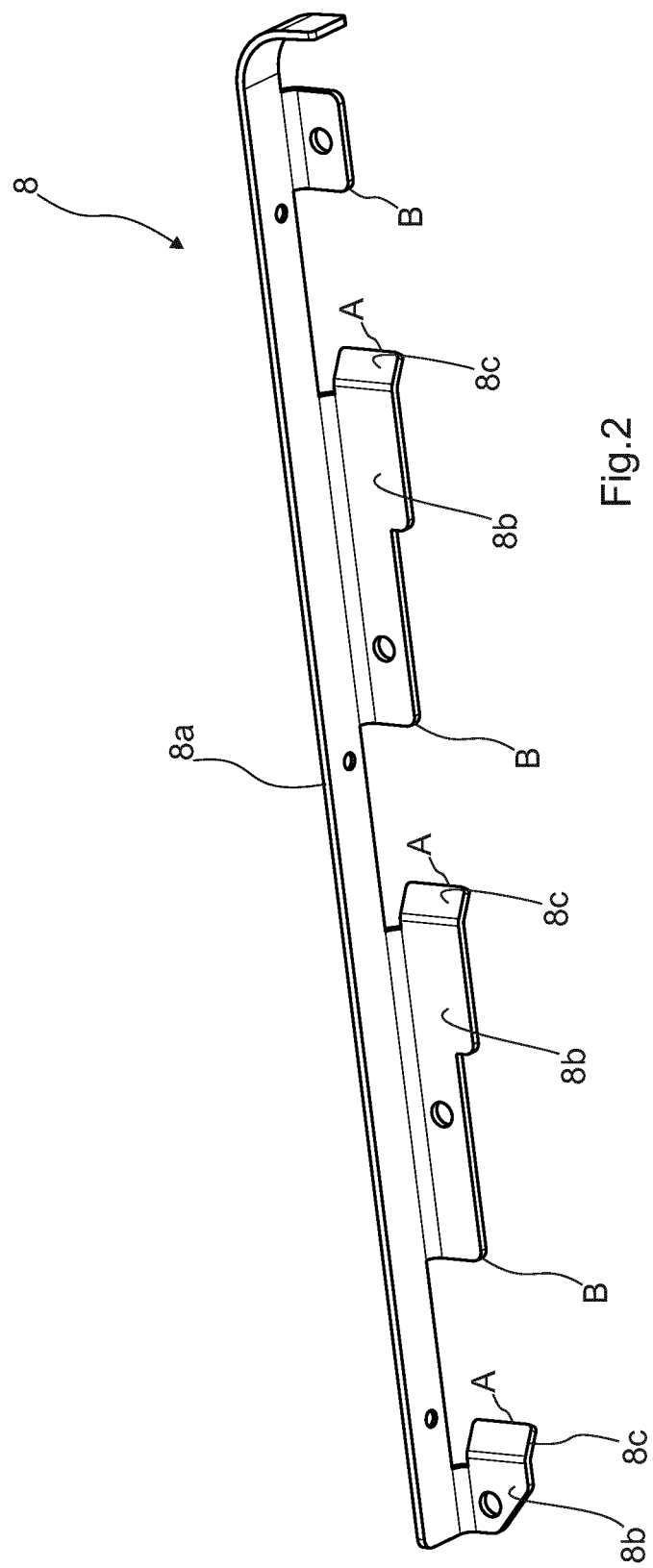
Figure 3:
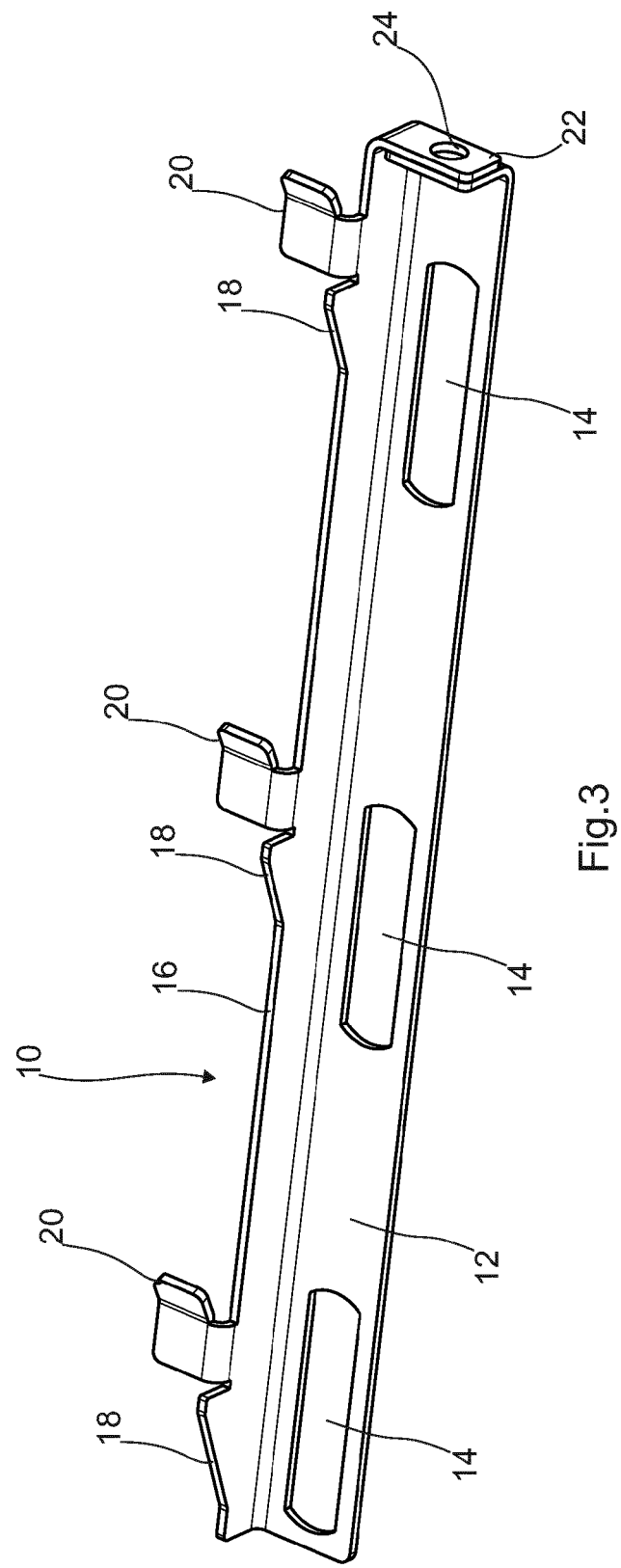

The invention will be explained in more detail below on the basis of a preferred exemplary embodiment with reference to the attached FIGS., of which:

FIG. 1 shows a part of a preferably medical apparatus housing according to a preferred exemplary embodiment of the invention, FIG. 2 shows an engagement means component for installation on housing parts of the preferably medical apparatus housing and FIG. 3 shows a slide as a part of a locking mechanism according to the preferred exemplary embodiment of the invention.

DETAILED DESCRIPTION

The apparatus housing partially illustrated in FIG. 1 comprises a base plate 1, at least two side plates 2 which are to be connected to the base plate 1, and a hood (not illustrated) with a cross-section possibly bent so as to have a U-shaped design; hence, said hood integrally forms two further side plates and a cover in one piece. As an alternative to this, it is also possible that each side of the housing (including the bottom and the cover) is formed of a respective plate element.

According to FIG. 1, the base plate 1 comprises one or more peripherally surrounding groove(s) 4 at its housing's inner surface, into which the side plates 2 can be inserted or are inserted according to the tongue-and-groove principle. In addition, a number of substantially equally spaced screw bases or studs 6 having an internal thread are formed along the grooves 4.

In FIG. 1, the housing which is only illustrated in part is provided with two opposing side plates 2 which are inserted or pressed upright into the grooves 4 already mentioned above. Further, a so-called engagement means component 8, as it is shown in FIG. 2, is mounted (screwed/riveted/welded etc.) to each side plate 2 in the peripheral region thereof.

In the present case, the engagement means component 8 consists of a sheet metal part comprising a sheet metal assembly strip 8a from which a number of longitudinally spaced tabs 8b protrude substantially at right angles. Each tab (or selected) tab 8b comprises a wedge-shaped fold 8c on (identical) longitudinal ends. Each tab (or selected) tab 8b thus forms two engagement means A, B for a locking mechanism as it will be described below on the basis of FIG. 1 and 3.

In the present case, the locking mechanism according to FIG. 3 consists of a lock or slide 10 which is formed by a sheet metal or cast metal part. It comprises a sheet metal assembly strip 12 in which a number of longitudinally spaced elongated slots 14 are formed in accordance with the number and the distance of the screw bases 6. In addition, the sheet metal assembly strip 12 is folded (by 90°) at one longitudinal edge to form a ledge 16 comprising a free upper edge where a number of wedge-shaped ramps 18 as well as tab-shaped detent lugs 20 are formed to be longitudinally spaced. The number and the positioning of the ramps 18 and the detent lugs 20 is selected such that—when the slide 10 is moved in a first longitudinal direction along the engagement means component 8—the detent lugs 20 come to engage the tabs 8b of the engagement means component 8 at mutually facing side edges (representing an associated engagement means) B in undercutting fashion and hence pulling them up, whereas the ramps 20 will be spaced from the tabs 8b of the engagement means component 8 at mutually facing side folds (also representing their associated engagement means) A. If the slide 10 is moved in the opposite longitudinal direction, the detent lugs 20 leave the engagement with the tabs 8b of the engagement means component 8, whereas the ramps 18 engage the tabs 8b of the engagement means component 8 and push them away. This procedure will be explained in more detail below in the context of the functional description of the locking mechanism.

At one longitudinal end, the lock/slide 10 comprises a fold 22 which is perpendicular to the sheet metal assembly strip 12 and in which a through-hole 24 is formed, as is illustrated in particular in FIG. 3. The orientation of the through-hole 24 is parallel to the sliding direction of the lock/slide 10. Finally, it is to be noted that the effective directions of the detent lugs 20 and the wedge-shaped ramps 18 are opposite each other. In other words, whereas the detent lugs 20 facilitate the process of reaching behind in the one longitudinal displacement direction, the ramps 18 slope down in the opposite longitudinal displacement direction, i.e. their wedge effect occurs in the opposite longitudinal displacement direction.

The assembly of the housing according to the invention as well as the mode of operation of the locking mechanism is described below on the basis of FIG. 1.

According to FIG. 1, a number of the screw bases 6 is formed on the (two) opposing longitudinal edges of the base plate 1. Two locks/slides 10 have their respective sheet metal assembly strips 12 mounted to the screw bases 6 so as to be displaceable in longitudinal direction, by passing the screw bases 6 through the elongated slots 14 in the sheet metal assembly strip 12; finally, retaining screws 26 are screwed to the screw bases 6 and prevent the lock/slide 10 from lifting off from the screw bases 6. In this way, the two locks/slides 10 can be moved in longitudinal direction in parallel on the base plate 1. The respective longitudinal ledges 16 comprising the detent lugs 20 and the ramps 18 are situated on the outwardly facing longitudinal side of each lock/slide 10 and are essentially perpendicular to the base plate's inner side.

For actuating the lock/slide 10, one actuation mechanism is provided in each case. Here, it consists of a set screw 28 which is screwed in the base plate 1 in the longitudinal direction of the lock/slide and has its end anchored in the respective through-hole 24 of the associated lock/slide 10 so as to be rotatable but axially fixed. In other words, upon turning the set screw 28 on the base plate 1, the latter is moved in the longitudinal direction of the screw, with this movement being transferred to the docked lock/slide 10 for its longitudinal displacement.

An engagement means component 8 is fixed (by screwing, riveting, welding etc.) on each side plate 2 on at least one longitudinal edge, in the present case on two opposing longitudinal edges, in such a manner that its tabs 8b defining the engagement means A, B can be caused to engage the ramps 18 and the detent lugs 20 of the associated slide 10.

For assembling the housing from said housing parts, the two illustrated side plates 2 are pressed upright into the grooves 4 formed on the base plate 1, for instance. Then, the two locks/slides 10 are actuated/shifted by means of the set screws 28 in such a manner that the detent lugs 20 formed thereon engage behind the tabs 8b formed on the engagement means components 8 and in this way pull them up. In this process, the two side plates 2 are pulled into the grooves 4 more firmly and retained there in a quasi self-locking manner with a high preload force (applied via the set screws). This measure achieves a tight connection between the illustrated side plates 2 and the base plate 1 as well as a connection which is impermeable for electromagnetic radiation.

In order to remove one of the side plates 2, for instance for the purpose of servicing enclosed apparatus elements (not illustrated), the corresponding set screw 28 is turned in the reverse direction and hence the lock/slide 10 is moved in a direction in which the detent lugs 20 leave the engagement with the tabs 8b of the engagement means component 8; instead, the ramps 18 engage the tabs 8b and exert a thrust thereon. With this, the respective side plate 2 is pushed out of the groove 4 on the base plate 1 corresponding to the wedge-shape of the ramps 18.

It is obvious that a common screw for actuating at least two parallel locks/slides 10 may be arranged instead of several set screws 28 individually provided for each lock/slide 10. It is also possible that the locks/slides 10 are arranged on the side plates 2 instead of on the base plate 1 (and the access hood which is not shown). Finally, it is not mandatory that the engagement points are formed by the illustrated tabs; they may also be formed by dowels or studs which are inserted in the engagement means component.

The invention claimed is:

1. A housing portion of an electric or electronic apparatus of medical design, the housing portion comprising at least two housing parts and a locking mechanism for connecting the at least two housing parts with each other, the locking mechanism being operable from outside the housing portion, the locking mechanism comprising at least one lock or slide which is held on a first housing part of the at least two housing parts, so as to be longitudinally displaceable, and is provided with at least one ramp and at least one undercut or detent lug spaced from the at least one ramp in a sliding direction, whereas a second housing part of the at least two housing parts is provided with at least one protrusion which is formed or arranged for defining at least two engagement means in such a manner that the engagement means, depending on a current sliding position of the at least one lock or slide, alternately comes into operative engagement with the at least one undercut or detent lug for pulling the second housing part toward the first housing part, or operative engagement with the at least one ramp for pushing the second housing part away from the first housing part, the housing portion further comprising an actuation mechanism for longitudinally shifting the at least one lock or slide from outside the housing portion, said actuation mechanism comprising a set screw which is screwed in the first housing part in a sliding direction of the at least one lock or slide and has a front face engaging the at least one lock or slide in order to push and pull the at least one lock or slide in a longitudinal direction.

2. The housing portion according to claim 1, wherein the first part is a base plate and the second part is a side wall which can be put together with the base plate in a tongue-and-groove connection.

3. The housing portion according to claim 2, wherein at least one groove is formed at least on an inner surface of the base plate along a perimeter of the base plate, with a respective groove depth being oriented so as to be perpendicular to the inner surface for the upright plug-in reception of the side wall.

4. The housing according to claim 1, wherein a number of serially spaced guide pins is formed on at least one of the first housing part and the second housing part at an edge on an inner surface, the number of serially spaced guide pins provided for longitudinally guiding the lock or slide.

5. The housing portion according to claim 4, wherein the lock or slide comprises a number of longitudinal through-slots which are serially spaced in a longitudinal direction and in which the guide pins are inserted or can be inserted so as to slide in the longitudinal direction.

6. The housing portion according to claim 1, wherein the lock or slide is manufactured from a sheet metal or cast metal part.

7. The housing portion according to claim 1, wherein the at least one protrusion is provided by a separate engagement means component which is fixed or can be fixed on the second housing part.

8. The housing portion according to claim 7, wherein the engagement means component is a sheet metal part comprising a number of lug or bolt-shaped, longitudinally spaced protrusions which each define one or two engagement means for cooperation with the at least one detent lug and/or the at least one ramp on the lock or slide.

* * * * *